United States Patent
Ryu et al.

[11] Patent Number: 5,907,519
[45] Date of Patent: May 25, 1999

[54] WRITE DRIVER CIRCUIT WITH WRITE-PER-BIT DATA MASKING FUNCTION

[75] Inventors: Je Hun Ryu; Jong Hee Han, both of Kyoungki-do, Rep. of Korea

[73] Assignee: Hyundai Electronics Industries Co., Ltd., Kyoungki-do, Rep. of Korea

[21] Appl. No.: 08/963,804

[22] Filed: Nov. 4, 1997

[30] Foreign Application Priority Data

Nov. 6, 1996 [KR] Rep. of Korea ................ 96-52252

[51] Int. Cl.⁶ .................................................. G11C 13/00
[52] U.S. Cl. ............................... 365/230.01; 365/189.05
[58] Field of Search ..................... 365/189.01, 230.01, 365/49, 230.03, 230.06, 230.05, 189.05

[56] References Cited

U.S. PATENT DOCUMENTS 4,933,900  6/1990  Yamaguchi et al. ............... 365/189.01
5,315,560  5/1994  Nishimoto et al. .
5,511,025  4/1996  Smith et al. .

Primary Examiner—Terrell W. Fears
Attorney, Agent, or Firm—Nath & Associates; Gary M. Nath; Harold L. Novick

[57] ABSTRACT

A write driver circuit with a write-per-bit data masking function, comprising a masking register for inputting data to be written in a memory cell and generating masking data with respect to the input data, a first output controller for determining masking of the input data in response to an output signal from the masking register, a second output controller for determining masking of an inverted one of the input data in response to the output signal from the masking register, and an output unit for transferring output data from the first and second output controllers to data input/output lines of a memory device. According to the present invention, a WPB data masking operation is not performed at the column active step but at the row active step. Therefore, a write speed is enhanced by removing a conventional write delay time resulting from the execution of the WPB data masking operation at the column active step.

4 Claims, 2 Drawing Sheets

WRITE DRIVER CIRCUIT WITH WRITE-PER-BIT DATA MASKING FUNCTION

BACKGROUND OF THE INVENTION

1. Field of the Invention

The present invention relates in general to a write driver circuit with a write-per-bit (referred to hereinafter as WPB) data masking function, and more particularly to a write driver circuit for performing a WPB data masking operation instead of a data input buffer so that a WPB operation can be accomplished at high speed.

2. Description of the Prior Art

Generally, a WPB data masking operation is performed in a memory device with a large number of banks. The execution of the WPB data masking operation is determined according to the input of a row active command and enabled according to the input of a column active command.

In other words, because the WPB data masking operation is performed by an input buffer of the memory device and a plurality of memory banks share the input buffer, the enabling of the WPB data masking operation is determined according to which one of the banks is made column-active.

FIG. 1 is a circuit diagram of a conventional input buffer with a WPB data masking function. As shown in this drawing, the input buffer comprises an input unit 1 for inputting data IN to be written in a memory cell, through an input pad, first and second delay circuits 2 and 3 for delaying output data from the input unit 1, respectively, a first latch circuit 4 for latching output data /din from the first delay circuit 2 in response to a load column register enable signal lcr, a second latch circuit 5 for latching the output data /din from the first delay circuit 2 in response to a load masking register enable signal lmr, an output unit 6 for transferring output data from the second delay circuit 3 and first latch circuit 4 to a write driver circuit (not shown), and an output controller 7 for controlling the output of the output unit 6 in response to an output signal from the second latch circuit 5 and a WPB signal. The output controller 7 includes an inverter for inverting the WPB signal, and a NOR gate for NORing the output signal from the second latch circuit 5 and an output signal /WPB from the inverter. The write driver circuit is adapted to write output data from the output unit 6 in a memory cell in response to a normal data/block write data output enable signal (not shown).

The operation of the input buffer with the above-mentioned construction will hereinafter be described.

If data to be written is inputted through the input pad, then it is delayed by the first and second delay circuits 2 and 3, respectively. The output data din from the second delay circuit 3 is transferred as normal write data to the write driver circuit through the output unit 6. The output data /din from the first delay circuit 2 is latched by the first and second latch circuits 4 and 5, respectively, in response to the load column register enable signal lcr and load masking register enable signal lmr and then transferred as block write data to the write driver circuit through the output unit 6.

At this time, the output data from the output unit 6 is transferred or blocked to the write driver circuit according to a state of an output signal from the NOR gate in the output controller 7.

Namely, in the case where data to be masked is present, the WPB signal is enabled high in logic and then inverted into low in logic by the inverter. The low logic signal from the inverter is applied to one input terminal of the NOR gate, the other input terminal of which is applied with the output signal from the second latch circuit 5 which is low in logic.

As a result, the output signal from the NOR gate becomes high in logic to turn off output terminals of the output unit 6. Thereafter, when the masking operation is required to be released, the WPB signal is disabled low in logic so that the normal write operation can be performed.

As mentioned above, the conventional WPB data masking operation is performed by the input buffer to mask the data input to the write driver circuit. To this end, the conventional WPB data masking operation should be executed when the column active signal is inputted.

For this reason, which one of the banks made column-active must inevitably be determined at the initial clock of the WPB operation. Such a determination step delays the write execution, resulting in the formation of a critical path.

SUMMARY OF THE INVENTION

Therefore, the present invention has been made in view of the above problem, and it is an object of the present invention to provide a write driver circuit with a WPB data masking function, which is capable of performing a WPB data masking operation to reduce a write delay time.

In accordance with the present invention, the above and other objects can be accomplished by a provision of a write driver circuit with a write-per-bit data masking function, comprising a masking register for inputting data to be written in a memory cell and generating masking data with respect to the input data; a first output controller for determining masking of the input data in response to an output signal from the masking register; a second output controller for determining masking of an inverted one of the input data in response to the output signal from the masking register; and an output unit for transferring output data from the first and second output controllers to data input/output lines of a memory device.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

In accordance with the present invention, a WPB data masking circuit is implemented by providing a WPB data masking operation controller for a general write driver circuit.

Figure 1:
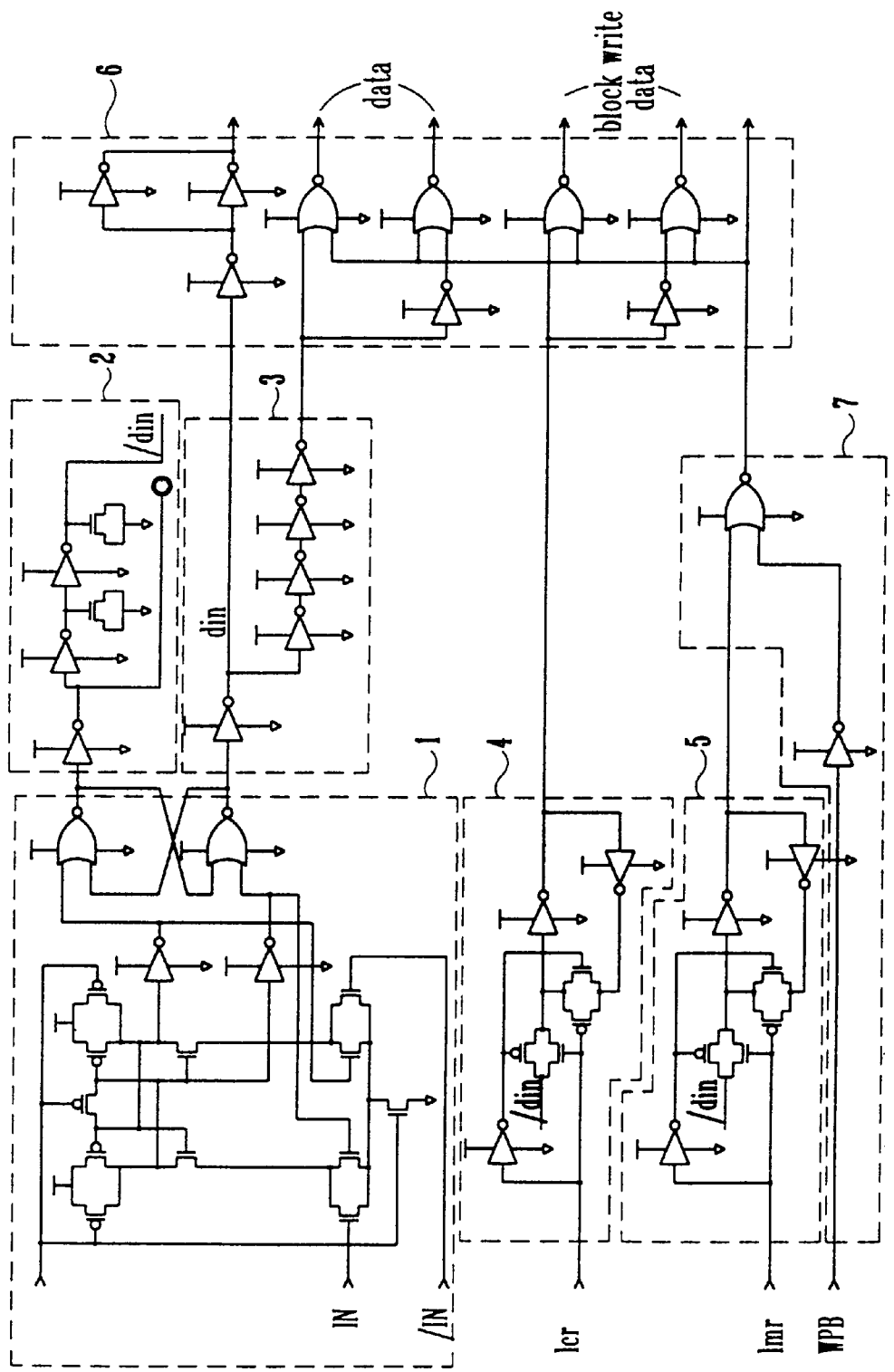
FIG. 1 is a circuit diagram of a conventional input buffer with a WPB data masking function.
Figure 2:
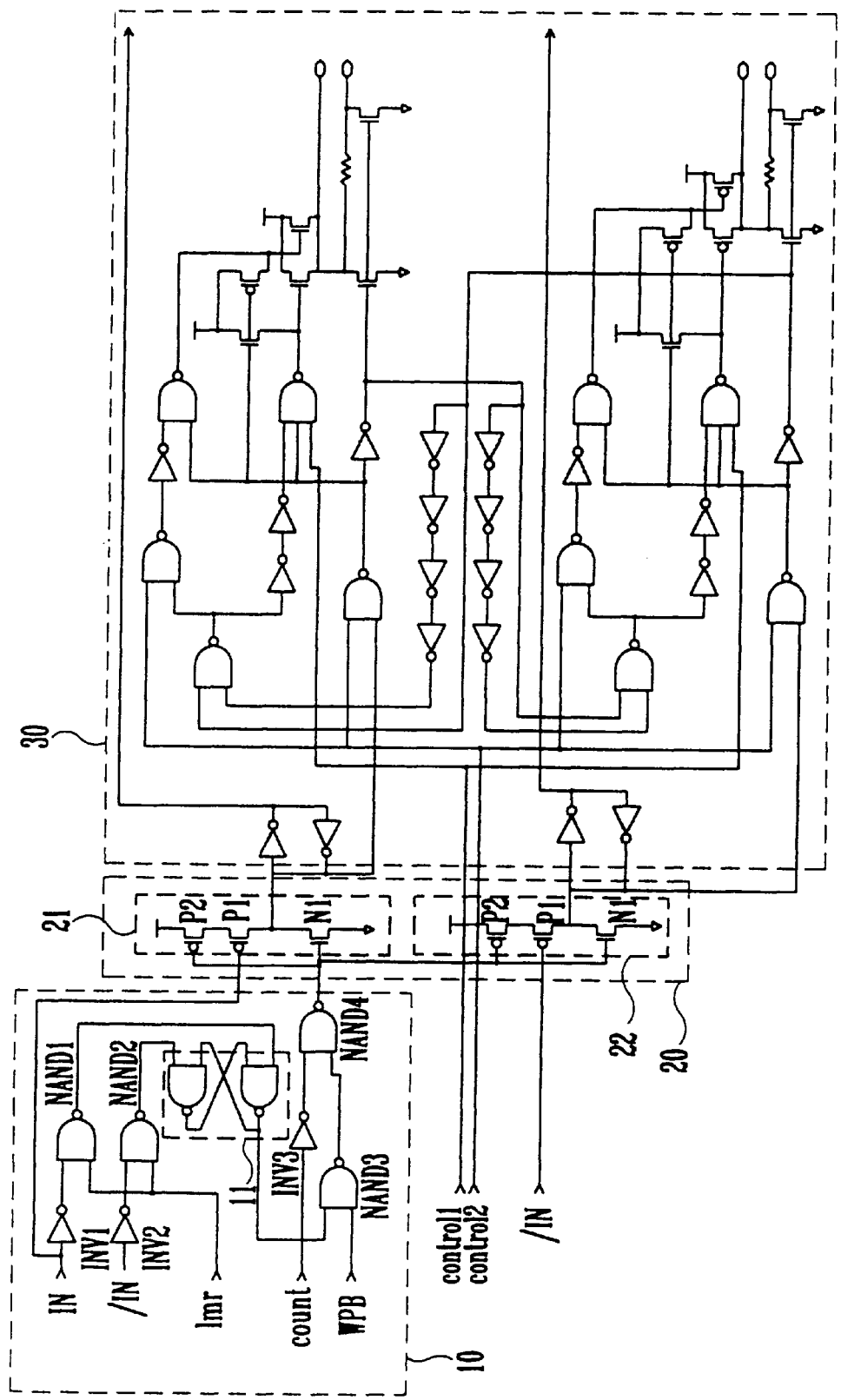
FIG. 2 is a circuit diagram of a write driver circuit with a WPB data masking function in accordance with the present invention.

FIG. 2 is a circuit diagram of a write driver circuit with a WPB data masking function in accordance with the present invention. As shown in this drawing, the write driver circuit comprises a masking register 10 for inputting data to be written in a memory cell, from a data input terminal IN and generating masking data with respect to the input data, and an output control circuit 20 including first and second output controllers 21 and 22.

The first output controller 21 is adapted to control the transfer of the input data from the data input terminal IN to a data output unit 30 in response to an output signal from the masking register 10, and the second output controller 22 is adapted to control the transfer of input data from a data input terminal /IN to the data output unit 30 in response to the output signal from the masking register 10.

The output unit 30 is adapted to transfer output data from the first and second output controllers 21 and 22 to data input/output lines IO and /IO, respectively, to write them in memory cells.

The masking register 10 includes an inverter INV1 for inverting the input data from the data input terminal IN, a NAND gate NAND1 for NANDing an output signal from the inverter INV1 and a load masking register enable signal lmr, an inverter INV2 for inverting the input data from the data input terminal /IN, a NAND gate NAND2 for NANDing an output signal from the inverter INV2 and the load masking register enable signal lmr, a latch circuit 11 for latching output signals from the NAND gates NAND1 and NAND2, a NAND gate NAND3 for NANDing an output signal from the latch circuit 11 and a WPB signal, an inverter INV3 for inverting a count signal, and a NAND gate NAND4 for NANDing an output signal from the NAND gate NAND3 and an output signal from the inverter INV3 and outputting the NANDed result as the masking data.

Each of the first and second output controllers 21 and 22 includes a PMOS transistor P1 having its gate for receiving the input data from the data input terminal IN or /IN, an NMOS transistor N1 connected between one terminal of the PMOS transistor P1 and a ground voltage terminal and having its gate for inputting an output signal from the NAND gate NAND4 in the masking register 10, and a PMOS transistor P2 connected between a supply voltage terminal and the other terminal of the PMOS transistor P1 and having its gate for inputting the output signal from the NAND gate NAND4. The NMOS transistor N1 is turned on or off in response to the output signal from the NAND gate NAND4 to block or transfer the data from the data input terminal IN or /IN to the output unit 30. The PMOS transistor P2 is turned on or off in response to the output signal from the NAND gate NAND4 to transfer or block a voltage from the supply voltage terminal to the PMOS transistor P1.

The operation of the write driver circuit with the above-mentioned construction will hereinafter be described in detail. Here, the description will be made with respect to only the parts connected to one data input terminal.

If data to be written in a memory cell is inputted through the data input terminal IN, then it is applied to one input terminal of the NAND gate NAND1, the other input terminal of which is applied with the load masking register enable signal lmr. The NAND gate NAND1 NANDs the input data from the data input terminal IN and the load masking register enable signal lmr and outputs the NANDed result as the masking data.

Noticeably, in the case where a certain one of a plurality of bits must be written differently from the other bits, the masking data is used to mask off the corresponding bit to output it through the data input/output line.

The masking data from the NAND gate NAND1 is applied to one input terminal of the NAND gate NAND3, the other input terminal of which is applied with the WPB signal. Here, the WPB signal is a high active signal similarly to the conventional one.

The output signal from the NAND gate NAND3 is NANDed with the count signal inverted by the inverter INV3 by the NAND gate NAND4 which then outputs the NANDed result to the gate of the NMOS transistor N1 in the first output controller 21. The first output controller 21 blocks or transfers the input data from the data input terminal IN to the output unit 30 according to a state of the output signal from the NAND gate NAND4.

In the preferred embodiment of the present invention, if the masking data stored in the masking register 10 is high in logic, then it indicates a mask-on state. However, if the masking data stored in the masking register 10 is low in logic, then it indicates a mask-off state. In other words, in the case where the masking data stored in the masking register 10 is high in logic under the condition that the WPB signal is high in logic, the data from the data input terminal is masked so that it cannot be placed on the data input/output line. However, in the case where the masking data stored in the masking register 10 is low in logic under the condition that the WPB signal is high in logic, the data from the data input terminal is not masked so that it can be placed on the data input/output line. Such mask-on/off operations will hereinafter be mentioned in more detail with reference to the circuit of FIG. 2.

In the masking register 10, if the masking data from the NAND gate NAND1 and the WPB signal are both high in logic, the output signal from the NAND gate NAND3 becomes low in logic.

Because the count signal inverted by the inverter INV3 is low in logic, the output signal from the NAND gate NAND4 becomes high in logic. Then, the high logic signal from the NAND gate NAND4 is applied to the gate of the NMOS transistor N1 in the first output controller 21 to turn it on. As the NMOS transistor N1 is turned on, the input data applied to the PMOS transistor P1 is transferred to the ground voltage terminal.

As a result, the input data from the data input terminal IN is not transferred to the output unit 30 but masked. On the other hand, in the case where the input data from the data input terminal IN must not be masked but transferred to the output unit 30, the WPB signal becomes low in logic, thereby causing the NMOS transistor N1 in the first output controller 21 to be turned off. As a result, the input data applied to the PMOS transistor P1 is directly transferred to the output unit 30.

Finally, the input data transferred to the output unit 30 is placed on the data input/output line of the corresponding cell, as well known in the art.

As apparent from the above description, according to the present invention, the WPB data masking operation is not performed at the column active step but at the row active step. Therefore, the present invention has the effect of enhancing a write speed by removing the conventional write delay resulting from the execution of the WPB data masking operation at the column active step.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A write driver circuit with a write-per-bit data masking function, comprising:

a masking register for inputting data to be written in a memory cell and generating masking data with respect to the input data;

a first output controller for determining masking of said input data in response to an output signal from said masking register;

a second output controller for determining masking of an inverted one of said input data in response to the output signal from said masking register; and an output unit for transferring output data from said first and second output controllers to data input/output lines of a memory device.

2. A write driver circuit with a write-per-bit data masking function, as set forth in claim 1, wherein said masking register includes:

a first inverter for inverting said input data;

a first NAND gate for NANDing an output signal from said first inverter and a load masking register enable signal;

a second inverter for inverting said inverted input data;

a second NAND gate for NANDing an output signal from said second inverter and said load masking register enable signal;

a latch circuit for latching output signals from said first and second NAND gates;

a third NAND gate for NANDing an output signal from said latch circuit and a write-per-bit signal;

a third inverter for inverting a count signal; and a fourth NAND gate for NANDing an output signal from said third NAND gate and an output signal from said third inverter and outputting the NANDed result as said masking data.

3. A write driver circuit with a write-per-bit data masking function, as set forth in claim 1, wherein said first output controller includes:

a first MOS transistor having its gate for receiving said input data;

a second MOS transistor connected between one terminal of said first MOS transistor and a ground voltage terminal and having its gate for inputting the output signal from said masking register, said second MOS transistor being turned on or off in response to the output signal from said masking register to block or transfer said input data to said output unit; and a third MOS transistor connected between a supply voltage terminal and the other terminal of said first MOS transistor and having its gate for inputting the output signal from said masking register, said third MOS transistor being turned on or off in response to the output signal from said masking register to transfer or block a voltage from said supply voltage terminal to said first MOS transistor.

4. A write driver circuit with a write-per-bit data masking function, as set forth in claim 1, wherein said second output controller includes:

a first MOS transistor having its gate for receiving said inverted input data;

a second MOS transistor connected between one terminal of said first MOS transistor and a ground voltage terminal and having its gate for inputting the output signal from said masking register, said second MOS transistor being turned on or off in response to the output signal from said masking register to block or transfer said inverted input data to said output unit; and a third MOS transistor connected between a supply voltage terminal and the other terminal of said first MOS transistor and having its gate for inputting the output signal from said masking register, said third MOS transistor being turned on or off in response to the output signal from said masking register to transfer or block a voltage from said supply voltage terminal to said first MOS transistor.

* * * * *